(12) United States Patent
Ashida et al.

(10) Patent No.: US 11,963,461 B2
(45) Date of Patent: Apr. 16, 2024

(54) MAGNETIC DOMAIN WALL MOVEMENT ELEMENT AND MAGNETIC RECORDING ARRAY

(71) Applicant: TDK CORPORATION, Tokyo (JP)

(72) Inventors: Takuya Ashida, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 217 days.

(21) Appl. No.: 17/331,211

(22) Filed: May 26, 2021

(65) Prior Publication Data

US 2021/0376229 A1    Dec. 2, 2021

(30) Foreign Application Priority Data

May 26, 2020 (JP) ................. 2020-091151
Mar. 23, 2021 (JP) ................. 2021-048982

(51) Int. Cl.
*H10N 50/80* (2023.01)
*H10B 61/00* (2023.01)

(52) U.S. Cl.
CPC ............. *H10N 50/80* (2023.02); *H10B 61/22* (2023.02)

(58) Field of Classification Search
CPC ................................ H10N 50/80; H10B 61/22
USPC ...................................................... 257/427
See application file for complete search history.

(56) References Cited

U.S. PATENT DOCUMENTS

| | | | | |
|---|---|---|---|---|
| 2002/0186514 | A1* | 12/2002 | Childress | G11B 5/3903 |
| 2010/0193889 | A1 | 8/2010 | Nagahara et al. | |
| 2018/0040357 | A1* | 2/2018 | Shirotori | H10N 50/10 |
| 2018/0123029 | A1* | 5/2018 | Park | H10N 50/10 |
| 2018/0159024 | A1 | 6/2018 | Buyandalai et al. | |
| 2018/0375019 | A1* | 12/2018 | Park | H10B 61/00 |
| 2019/0333558 | A1 | 10/2019 | Shibata | |
| 2020/0235291 | A1* | 7/2020 | Park | H10N 50/10 |
| 2021/0288247 | A1* | 9/2021 | Nowak | H10N 50/01 |

FOREIGN PATENT DOCUMENTS

| | | |
|---|---|---|
| CN | 110268515 A | 9/2019 |
| JP | 5472830 B2 | 4/2014 |
| JP | 6275806 B1 | 2/2018 |
| WO | 2009/019949 A1 | 2/2009 |
| WO | 2021/006219 A1 | 1/2021 |

* cited by examiner

*Primary Examiner* — Jami Valentine Miller
(74) *Attorney, Agent, or Firm* — Oliff PLC

(57) ABSTRACT

A magnetic domain wall movement element according to the present embodiment includes a first ferromagnetic layer, a nonmagnetic layer, and a second ferromagnetic layer that are laminated in an order from a side close to a substrate. On a cross-section along a lamination direction and a second direction orthogonal to a first direction in which the first ferromagnetic layer extends in a plan view from the lamination direction, a shortest width of the first ferromagnetic layer in the second direction is shorter than a width of the nonmagnetic layer in the second direction.

19 Claims, 12 Drawing Sheets

MAGNETIC DOMAIN WALL MOVEMENT ELEMENT AND MAGNETIC RECORDING ARRAY

BACKGROUND OF THE INVENTION

Field of the Invention

The present invention relates to a magnetic domain wall movement element and a magnetic recording array.

Description of Related Art

Attention has been focused on next-generation nonvolatile memories which will replace flash memories and the like for which miniaturization has reached its limit. For example, magnetoresistive random access memory (MRAM), resistance random access memory (ReRAM), phase change random access memory (PCRAM), and the like are known as next-generation nonvolatile memory.

An MRAM utilizes a change in the resistance value caused by a change in the direction of magnetization for data recording. Data recording is carried out by each magnetoresistance change element constituting an MRAM. For example, Patent Document 1 discloses a three terminal-type magnetoresistance effect element in which paths for a writing current and a reading current are divided.

PATENT DOCUMENTS

[Patent Document 1] Japanese Patent No. 6275806

SUMMARY OF THE INVENTION

When a magnetoresistance effect element is miniaturized, processing such as slimming may be performed. Slimming is a process in which a side surface of the magnetoresistance effect element is irradiated with an ion beam to reduce an area of the magnetoresistance effect element in a plan view. However, if an exposed metal surface is irradiated with an ion beam, a portion of a metal may scatter and adhere to a side wall of the magnetoresistance effect element again. Impurities which have adhered to the side wall of the magnetoresistance effect element cause deterioration in magnetic characteristics of a ferromagnetic substance constituting the magnetoresistance effect element. In addition, adhered impurities also cause leakage of the magnetoresistance effect element. Impurities which have adhered to the side wall of a magnetoresistance effect element degrade reliability of the magnetoresistance effect element.

The present invention has been made in consideration of the foregoing problems and provides a magnetoresistance effect element and a magnetic recording array having high reliability.

(1) According to a first aspect, a magnetic domain wall movement element is provided including a first ferromagnetic layer, a nonmagnetic layer, and a second ferromagnetic layer that are laminated in an order from a side close to a substrate. On a cross-section along a lamination direction and a second direction orthogonal to a first direction in which the first ferromagnetic layer extends in a plan view from the lamination direction, a shortest width of the first ferromagnetic layer in the second direction is shorter than a width of the nonmagnetic layer in the second direction.

(2) In the magnetic domain wall movement element according to the foregoing aspect, on the cross-section, a side surface of the first ferromagnetic layer may be inclined with respect to the lamination direction.

(3) In the magnetic domain wall movement element according to the foregoing aspect, on the cross-section, the side surface of the first ferromagnetic layer may have a first inclined surface and a second inclined surface. The first inclined surface may be inclined toward a center of the first ferromagnetic layer in the second direction from a lower end of the first ferromagnetic layer on a side close to the substrate. The second inclined surface may be inclined toward the center of the first ferromagnetic layer in the second direction from an upper end of the first ferromagnetic layer on a side far from the substrate.

(4) In the magnetic domain wall movement element according to the foregoing aspect, the width of a first surface of the first ferromagnetic layer on the nonmagnetic layer side in the second direction may be shorter than the width of the nonmagnetic layer in the second direction.

(5) In the magnetic domain wall movement element according to the foregoing aspect, the position at which a width of the first ferromagnetic layer in the second direction is the shortest may be on the nonmagnetic layer side from a center of the first ferromagnetic layer in the lamination direction.

(6) In the magnetic domain wall movement element according to the foregoing aspect, the longest width of the first ferromagnetic layer in the second direction may be shorter than the width of the nonmagnetic layer in the second direction.

(7) In the magnetic domain wall movement element according to the foregoing aspect, a width of a second surface of the first ferromagnetic layer on a side far from the nonmagnetic layer in the second direction may be longer than the width of the nonmagnetic layer in the second direction.

(8) In the magnetic domain wall movement element according to the foregoing aspect, a thickness of the nonmagnetic layer may be 30 Å or larger.

(9) In the magnetic domain wall movement element according to the foregoing aspect, a milling rate of the nonmagnetic layer may be lower than a milling rate of the first ferromagnetic layer.

(10) The magnetic domain wall movement element according to the foregoing aspect may further include an underlayer that is provided on a side of the first ferromagnetic layer opposite to the nonmagnetic layer. A milling rate of the underlayer may be lower than the first ferromagnetic layer.

(11) In the magnetic domain wall movement element according to the foregoing aspect, the first ferromagnetic layer may include an element constituting the underlayer. An abundance ratio of the element may be higher in a first region of the first ferromagnetic layer on the underlayer side from a position at which the width of the first ferromagnetic layer in the second direction is the shortest in the lamination direction than in a second region of the first ferromagnetic layer on the nonmagnetic layer side from a position at which the width of the first ferromagnetic layer in the second direction is the shortest in the lamination direction.

(12) The magnetic domain wall movement element according to the foregoing aspect may further include a first conductive part and a second conductive part that sandwich the nonmagnetic layer in the first direction and are electrically connected to the first ferromagnetic layer via the underlayer. A width of each of the first conductive part and the second conductive part in the second direction may be wider than the width of the first ferromagnetic layer in the second direction. The milling rate of the underlayer may be lower than milling rates of the first conductive part and the second conductive part.

(13) The magnetic domain wall movement element according to the foregoing aspect may further include a metal layer having a different material or composition from the second ferromagnetic layer on a side next to the second ferromagnetic layer in the second direction.

(14) According to a second aspect, there is provided a magnetic recording array including a plurality of magnetic domain wall movement elements according to the foregoing aspects.

The magnetic domain wall movement element and the magnetic recording array according to the foregoing aspects have excellent reliability.

DETAILED DESCRIPTION OF THE INVENTION

Figure 1:
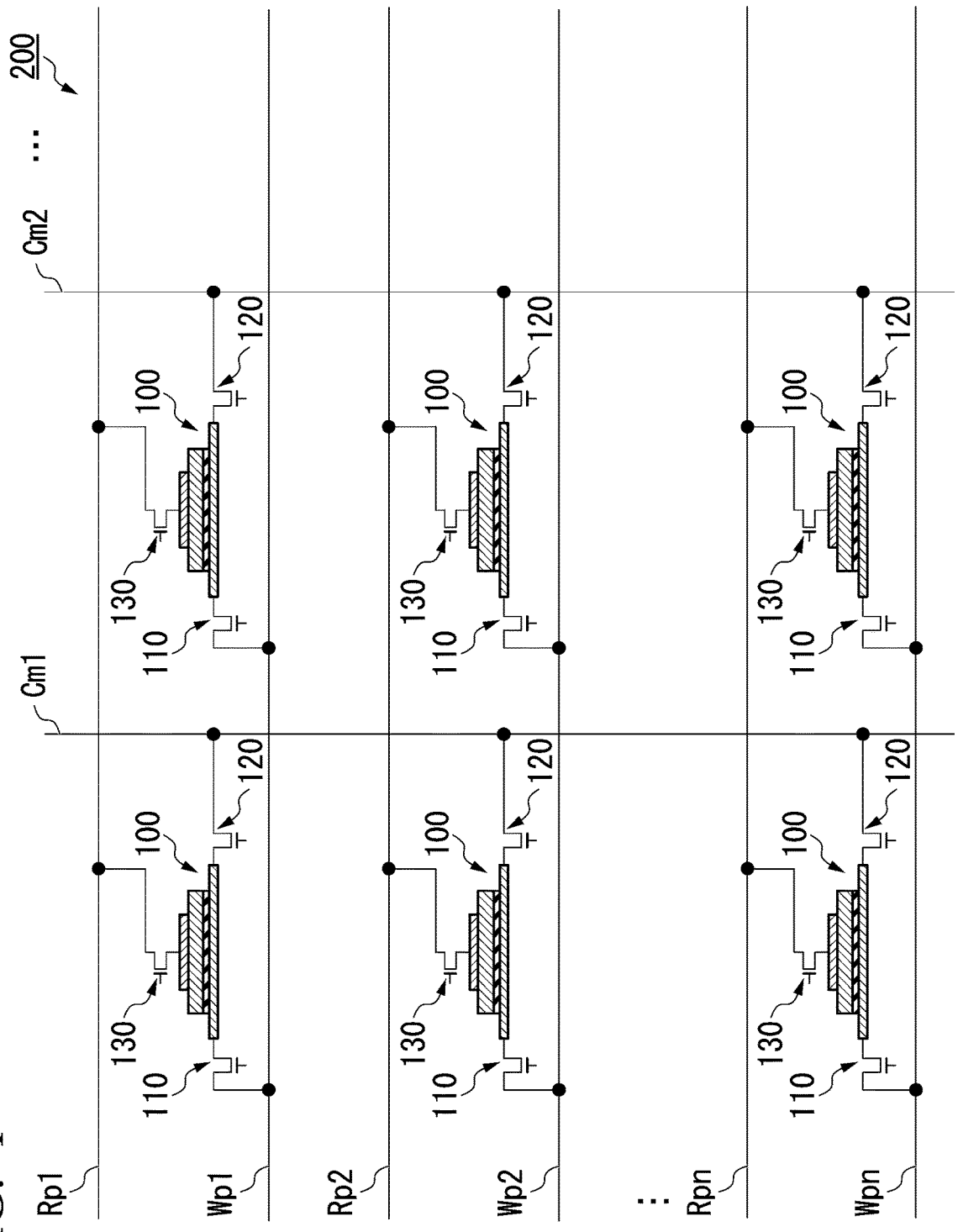
FIG. 1 is a view of a constitution of a magnetic recording array according to a first embodiment.

Hereinafter, the present embodiment will be described in detail with reference to the diagrams. In the drawings used in the following description, for the sake of convenience, characteristic portions may be illustrated in an enlarged manner in order to make characteristics of the present invention easy to understand, and dimensional proportions and the like of constituent elements may be different from those of actual elements. Materials, dimensions, and the like exemplified in the following description are examples. The present invention is not limited thereto and can be suitably changed and performed within a range in which the advantageous effects of the present invention are exhibited.

First, directions will be defined. An x direction and a y direction are directions substantially parallel to one surface of a substrate Sub which will be described below (refer to FIG. 2). The x direction is a direction in which a first ferromagnetic layer 10 (which will be described below) extends and is a direction toward a second conductive part 52 from a first conductive part 51 which will be described below. The y direction is a direction orthogonal to the x direction. A z direction is a direction toward a magnetic domain wall movement element 100 from the substrate Sub which will be described below. The z direction is an example of a lamination direction. In addition, in this specification, the expression "extending in the x direction" denotes that the dimension in the x direction is larger than the smallest dimension of the dimensions in the x direction, the y direction, and the z direction, for example. The same applies to a case of extending in other directions.

First Embodiment

FIG. 1 is a view of a constitution of a magnetic recording array according to a first embodiment. A magnetic recording array 200 includes a plurality of magnetic domain wall movement elements 100, a plurality of first wirings Wp1 to Wpn, a plurality of second wirings Cm1 to Cmn, a plurality of third wirings Rp1 to Rpn, a plurality of first switching elements 110, a plurality of second switching elements 120, and a plurality of third switching elements 130. For example, the magnetic recording array 200 can be utilized in a magnetic memory, a multiply and accumulate calculation device, and a neuromorphic device.

First Wiring, Second Wiring, and Third Wiring

The first wirings Wp1 to Wpn are writing wirings. The first wirings Wp1 to Wpn electrically connect a power supply to one or more magnetic domain wall movement elements 100. The power supply is connected to one end of the magnetic recording array 200 when in use.

The second wirings Cm1 to Cmn are common wirings. The common wirings are wirings which can be used both at the time of writing data and at the time of reading data. The second wirings Cm1 to Cmn electrically connect a reference electric potential to one or more magnetic domain wall movement elements 100. For example, the reference electric potential is a ground potential. The second wirings Cm1 to Cmn may be provided in each of a plurality of magnetic domain wall movement elements 100 or may be provided across a plurality of magnetic domain wall movement elements 100.

The third wirings Rp1 to Rpn are reading wirings. The third wirings Rp1 to Rpn electrically connect the power supply to one or more magnetic domain wall movement elements 100. The power supply is connected to one end of the magnetic recording array 200 when in use.

<First Switching Element, Second Switching Element, and Third Switching Element>

The first switching elements 110, the second switching elements 120, and the third switching elements 130 illustrated in FIG. 1 are respectively connected to the plurality of magnetic domain wall movement elements 100. The first switching elements 110 are connected to portions between the respective magnetic domain wall movement elements 100 and the first wirings Wp1 to Wpn. The second switching elements 120 are connected to portions between the respective magnetic domain wall movement elements 100 and the second wirings Cm1 to Cmn. The third switching elements 130 are connected to portions between the respective magnetic domain wall movement elements 100 and the third wirings Rp1 to Rpn.

When the first switching elements 110 and the second switching elements 120 are turned on, a writing current flows between the first wirings Wp1 to Wpn connected to predetermined magnetic domain wall movement elements 100 and the second wirings Cm1 to Cmn. When the second switching elements 120 and the third switching elements 130 are turned on, a reading current flows between the second wirings Cm1 to Cmn connected to predetermined magnetic domain wall movement elements 100 and the third wirings Rp1 to Rpn.

The first switching elements 110, the second switching elements 120, and the third switching elements 130 are elements for controlling a flow of a current. For example, the first switching elements 110, the second switching elements 120, and the third switching elements 130 are elements which utilize phase change in a crystal layer, such as a transistor and an ovonic threshold switch (OTS), elements which utilize change in a band structure, such as a metal-insulator transition (MIT) switch, elements which utilize a breakdown voltage, such as a Zener diode and an avalanche diode, or elements in which conductivity changes in accordance with change in atomic position.

Any of the first switching elements 110, the second switching elements 120, and the third switching elements 130 may be shared by magnetic domain wall movement elements 100 connected to the same wiring. For example, when the first switching elements 110 are shared, one first switching element 110 is provided on an upstream side of the first wirings Wp1 to Wpn. For example, when the second switching elements 120 are shared, one second switching element 120 is provided on an upstream side of the second wirings Cm1 to Cmn. For example, when the third switching elements 130 are shared, one third switching element 130 is provided on an upstream side of the third wirings Rp1 to Rpn.

Figure 2:
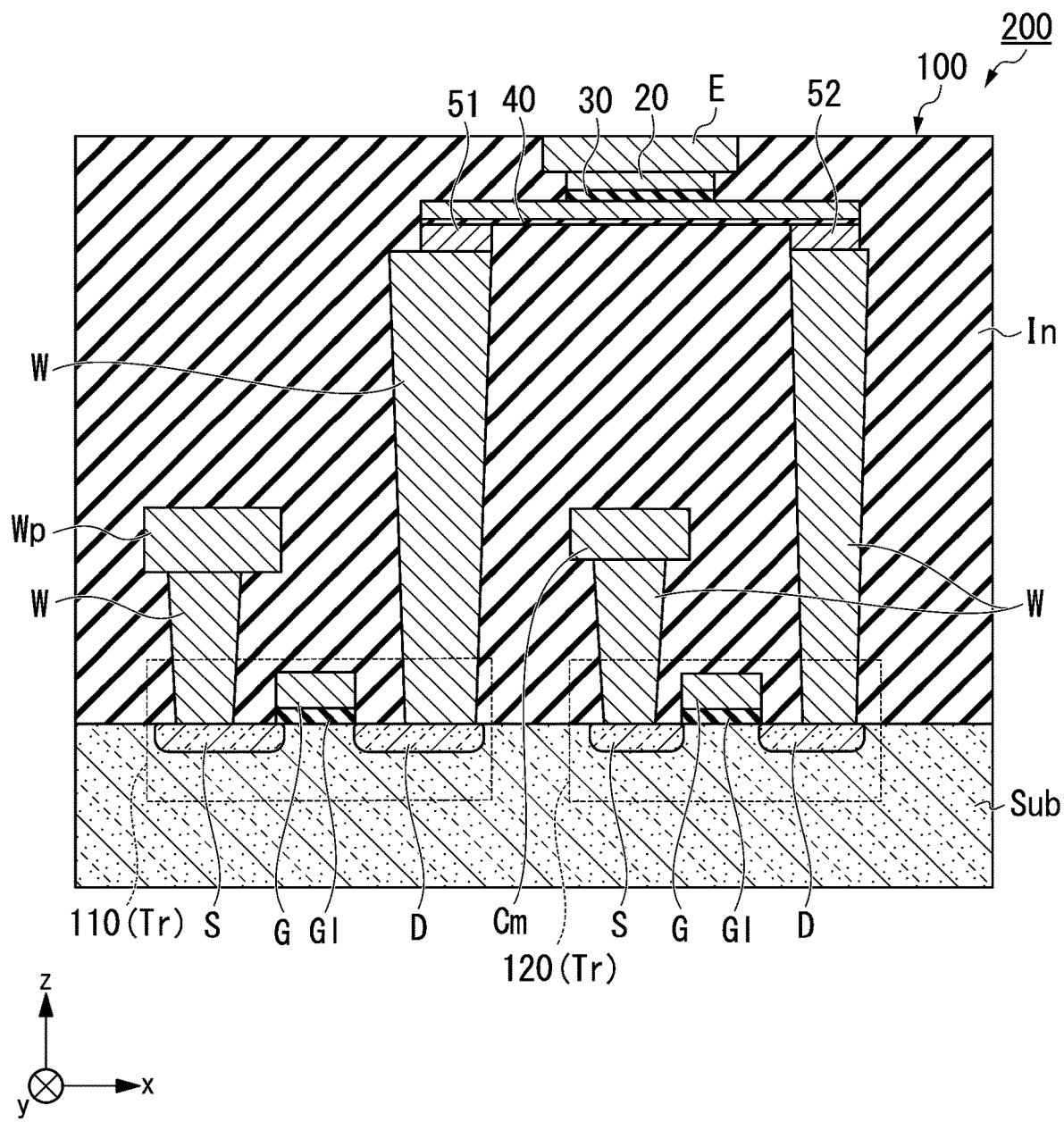
FIG. 2 is a cross-sectional view of a characteristic part of the magnetic recording array according to the first embodiment.

FIG. 2 is a cross-sectional view of a characteristic part of the magnetic recording array 200 according to the first embodiment. FIG. 2 is a cross section of one magnetic domain wall movement element 100 in FIG. 1 cut along an xz plane passing through the center of a width of the first ferromagnetic layer 10 in the y direction.

The first switching elements 110 and the second switching elements 120 illustrated in FIG. 2 are transistors Tr. The transistor Tr has a gate electrode G, a gate insulating film GI, and a source region S and a drain region D formed on the substrate Sub. For example, the substrate Sub is a semiconductor substrate. The third switching elements 130 are electrically connected to an electrode E and positioned in a depth direction with respect to the paper surface (+y direction), for example.

Each of the transistors Tr and the magnetic domain wall movement element 100 are electrically connected to each other via a wiring W. The wiring W includes a conductive material. For example, the wiring W extends in the z direction. For example, the wiring W is a via wiring formed in an opening part of an insulating layer In.

The magnetic domain wall movement element 100 and the transistors Tr are electrically separated from each other except for the wiring W by the insulating layer In. The insulating layer In is an insulating layer insulating wirings of multi-layer wirings or elements from each other. For example, the insulating layer In is made of silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

Magnetic Domain Wall Movement Element

Figure 3:
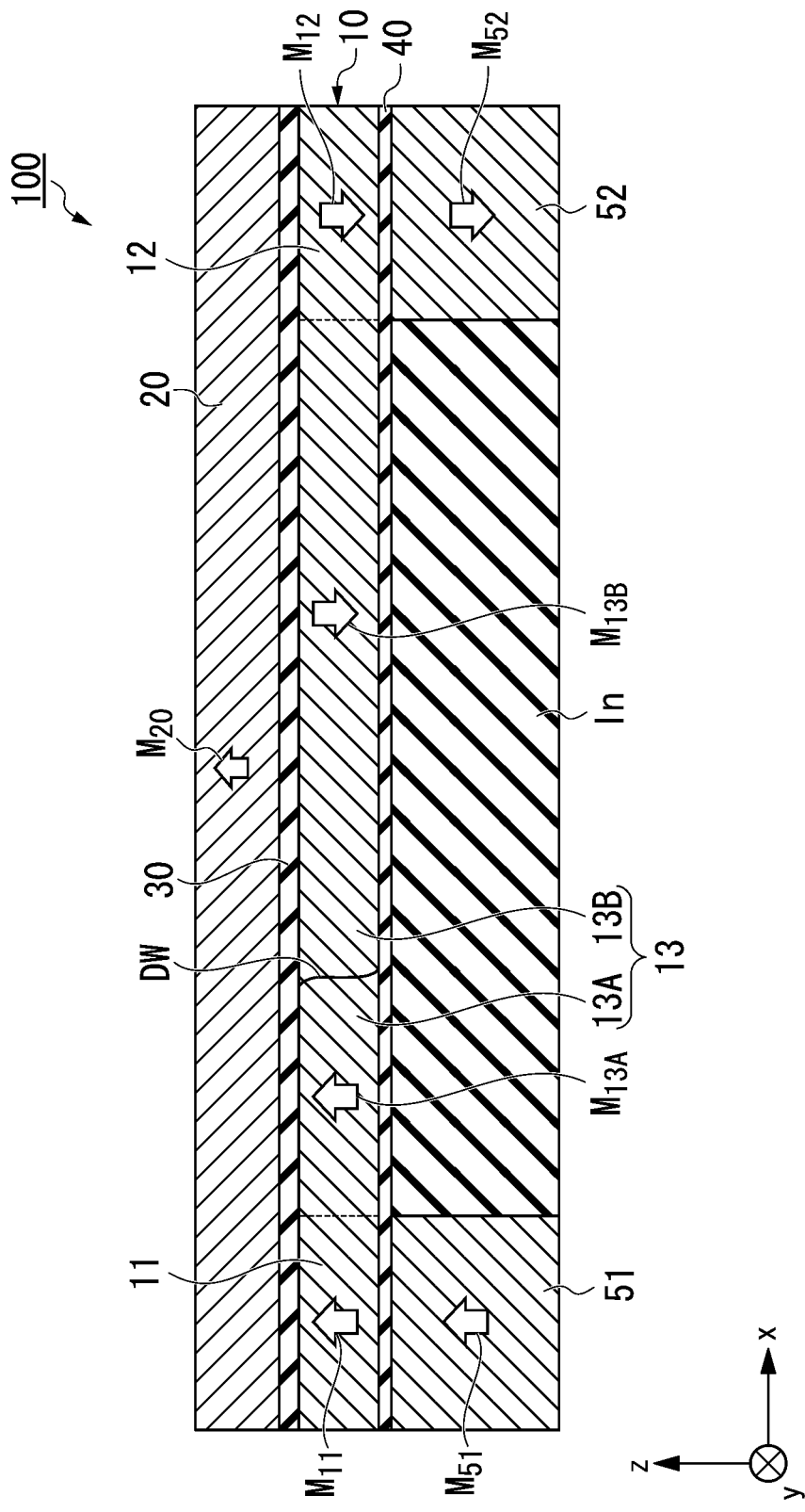
FIG. 3 is an xz cross-sectional view of a magnetic domain wall movement element according to the first embodiment.
Figure 4:
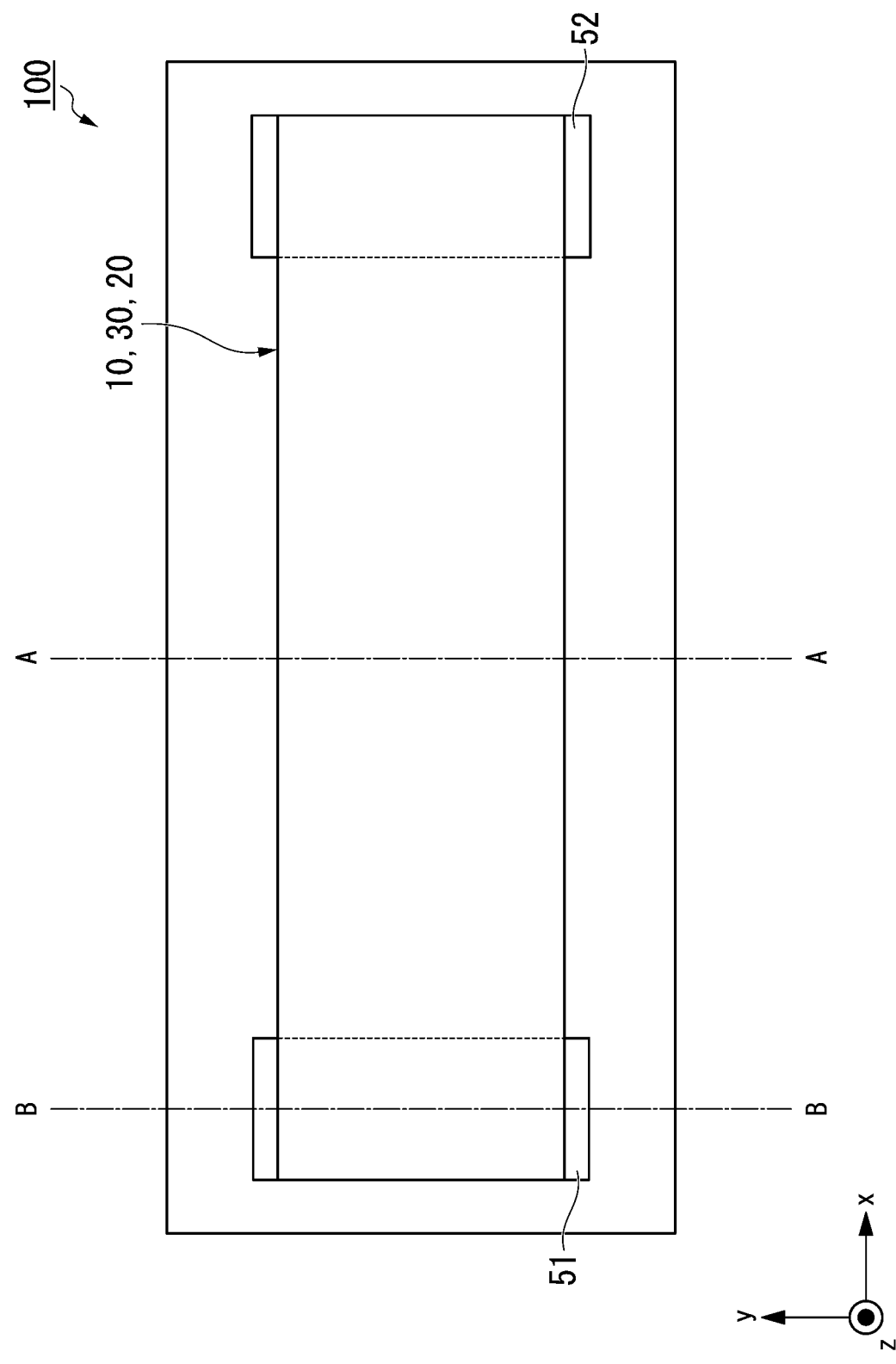
FIG. 4 is a plan view of the magnetic domain wall movement element according to the first embodiment.
Figure 5:
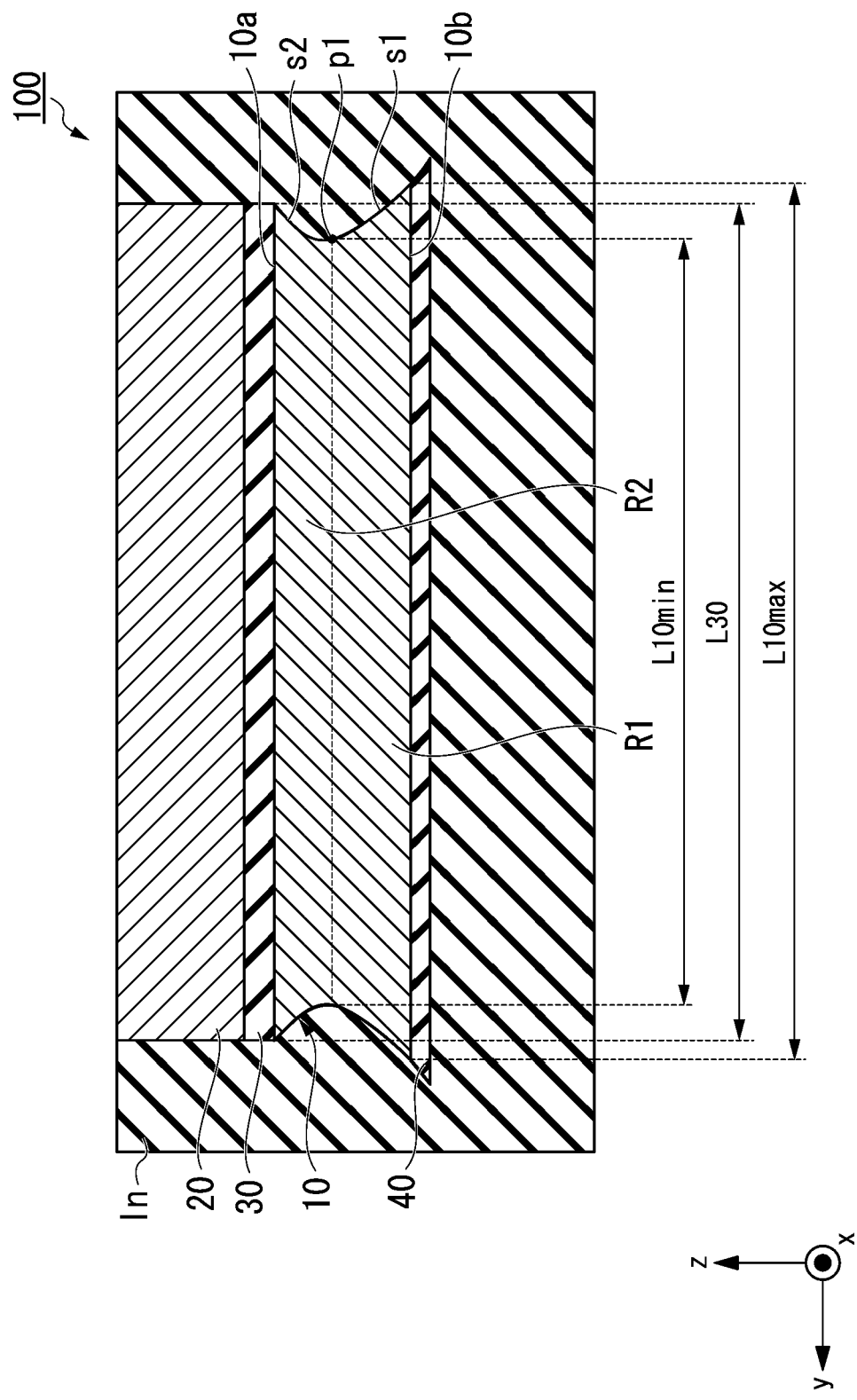
FIG. 5 is a yz cross-sectional view at a center of the magnetic domain wall movement element according to the first embodiment in an x direction.
Figure 6:
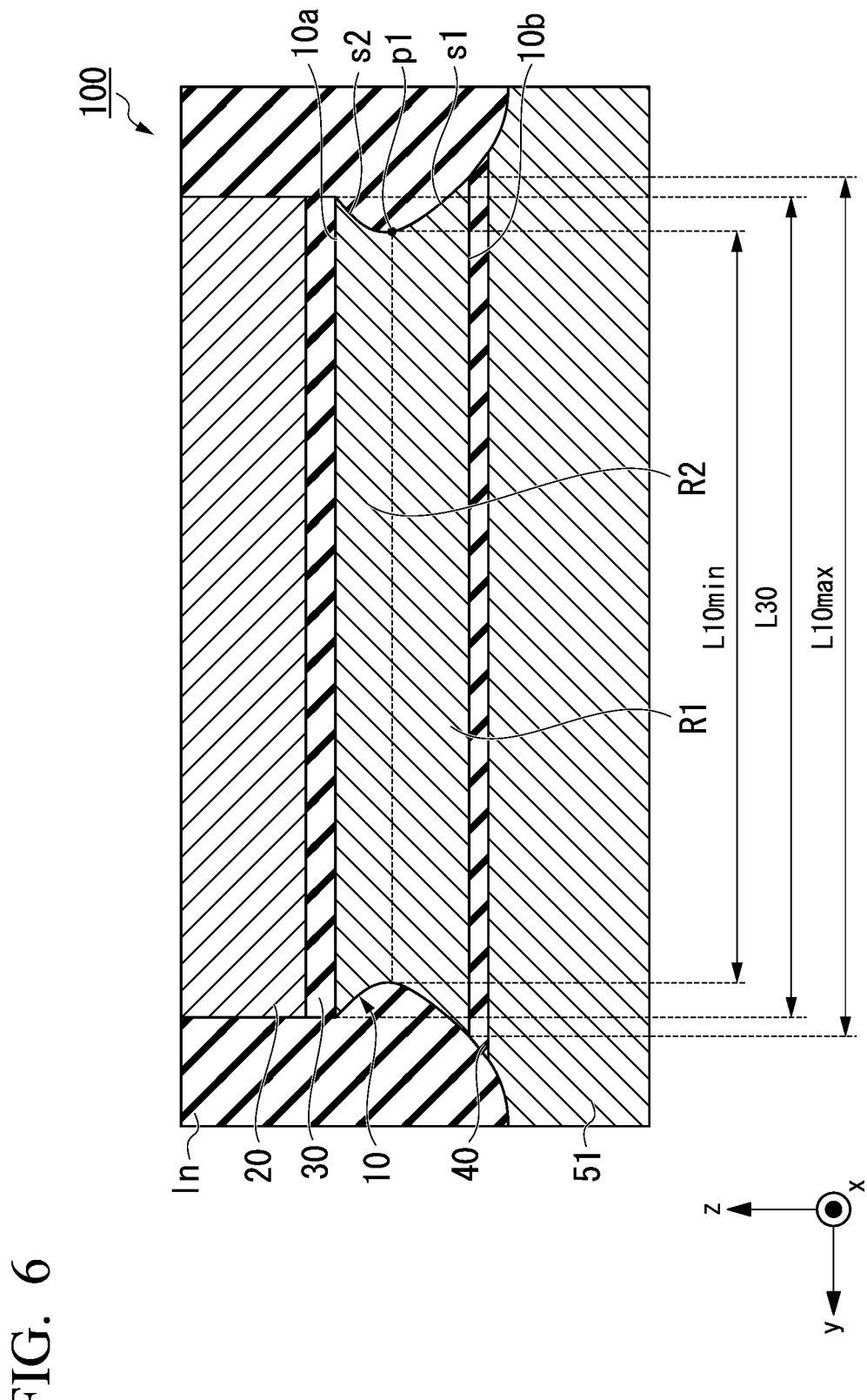
FIG. 6 is a yz cross-sectional view in a first conductive part of the magnetic domain wall movement element according to the first embodiment.

FIG. 3 is a cross-sectional view of the magnetic domain wall movement element 100 cut along an xz plane passing through the center of the first ferromagnetic layer 10 in the y direction. FIG. 4 is a plan view of the magnetic domain wall movement element 100 in the z direction. FIG. 5 is a cross-sectional view cut along a yz plane passing through the center of the magnetic domain wall movement element 100 in the x direction. FIG. 5 is a cross section of the magnetic domain wall movement element 100 cut along line A-A in FIG. 4. FIG. 6 is a cross-sectional view cut along a yz plane passing through the first conductive part 51 of the magnetic domain wall movement element 100. FIG. 6 is a cross section of the magnetic domain wall movement element 100 cut along line B-B in FIG. 4.

For example, the magnetic domain wall movement element 100 has the first ferromagnetic layer 10, a second ferromagnetic layer 20, a nonmagnetic layer 30, an underlayer 40, the first conductive part 51, and the second conductive part 52. For example, the first ferromagnetic layer 10, the nonmagnetic layer 30, and the second ferromagnetic layer 20 are laminated in this order from a side close to the substrate Sub. Another layer may be inserted between the first ferromagnetic layer 10 and the nonmagnetic layer 30 and between the nonmagnetic layer 30 and the second ferromagnetic layer 20. When data is written in the magnetic domain wall movement element 100, a writing current flows in the first ferromagnetic layer 10 between the first conductive part 51 and the second conductive part 52. When data is read from the magnetic domain wall movement element 100, a reading current flows between the first conductive part 51 or the second conductive part 52 and the second ferromagnetic layer 20.

First Ferromagnetic Layer

The first ferromagnetic layer 10 extends in the x direction. The first ferromagnetic layer 10 is electrified with a writing current. For example, the first ferromagnetic layer 10 has a rectangular shape in which the x direction is a long axis and the y direction is a short axis in a plan view from the z direction. For example, the first ferromagnetic layer 10 is on the substrate Sub side from the second ferromagnetic layer 20. A writing current flows from the first conductive part 51 toward the second conductive part 52 or from the second conductive part 52 toward the first conductive part 51 along the first ferromagnetic layer 10.

The first ferromagnetic layer 10 is a layer capable of performing magnetic recording of information in accordance with change in internal magnetic state. The first ferromagnetic layer 10 may be referred to as a magnetic recording layer or a magnetic domain wall moving layer.

As illustrated in FIG. 3, for example, the first ferromagnetic layer 10 has magnetization fixed regions 11 and 12 and a magnetic domain wall movement region 13. For example, the magnetic domain wall movement region 13 is sandwiched between the two magnetization fixed regions 11 and 12 in the x direction.

The magnetization fixed region 11 is a region overlapping the first conductive part 51 of the first ferromagnetic layer 10 when viewed from the z direction. The magnetization fixed region 12 is a region overlapping the second conductive part 52 of the first ferromagnetic layer 10 when viewed from the z direction. Magnetizations $M_{11}$ and $M_{12}$ of the magnetization fixed regions 11 and 12 are less likely to be subjected to magnetization reversal than magnetizations $M_{13A}$ and $M_{13B}$ of the magnetic domain wall movement region 13 and are not subjected to magnetization reversal even if an external force with a threshold at which the magnetizations $M_{13A}$ and $M_{13B}$ of the magnetic domain wall movement region 13 are reversed is applied. For this reason, it is said that the magnetizations $M_{11}$ and $M_{12}$ of the magnetization fixed regions 11 and 12 are fixed to the magnetizations $M_{13A}$ and $M_{13B}$ of the magnetic domain wall movement region 13.

The magnetization $M_{11}$ of the magnetization fixed region 11 and the magnetization $M_{12}$ of the magnetization fixed region 12 are oriented in directions different from each other. The magnetization $M_{11}$ of the magnetization fixed region 11 and the magnetization $M_{12}$ of the magnetization fixed region 12 are oriented in directions opposite to each other, for example. The magnetization $M_{11}$ of the magnetization fixed region 11 is oriented in +z direction, for example, and the magnetization $M_{12}$ of the magnetization fixed region 12 is oriented in −z direction, for example.

The magnetic domain wall movement region 13 is constituted of a first magnetic domain 13A and a second magnetic domain 13B. The first magnetic domain 13A is adjacent to the magnetization fixed region 11. The magnetization $M_{13A}$ of the first magnetic domain 13A is oriented in the same direction as the magnetization $M_{11}$ of the magnetization fixed region 11, for example, upon reception of influence of the magnetization $M_{11}$ of the magnetization fixed region 11. The second magnetic domain 13B is adjacent to the magnetization fixed region 12. The magnetization $M_{13B}$ of the second magnetic domain 13B is oriented in the same direction as the magnetization $M_{12}$ of the magnetization fixed region 12, for example, upon reception of influence of the magnetization $M_{12}$ of the magnetization fixed region 12. For this reason, the magnetization $M_{13A}$ of the first magnetic domain 13A and the magnetization $M_{13B}$ of the second magnetic domain 13B are oriented in directions different from each other. The magnetization $M_{13A}$ of the first magnetic domain 13A and the magnetization $M_{13B}$ of the second magnetic domain 13B are oriented in directions opposite to each other, for example.

A boundary between the first magnetic domain 13A and the second magnetic domain 13B is a magnetic domain wall DW. The magnetic domain wall DW moves inside the magnetic domain wall movement region 13. In principle, the magnetic domain wall DW does not invade the magnetization fixed regions 11 and 12.

In the magnetic domain wall movement region 13, the magnetic domain wall DW moves when a writing current flows in the x direction of the magnetic domain wall movement region 13. For example, if a writing current (for example, a current pulse) in +x direction is applied to the magnetic domain wall movement region 13, electrons flow in −x direction opposite to that of the current, and thus the magnetic domain wall DW moves in the −x direction. When a current flows from the first magnetic domain 13A toward the second magnetic domain 13B, electrons which have been spin-polarized in the second magnetic domain 13B cause magnetization reversal of the magnetization $M_{13A}$ of the first magnetic domain 13A. When the magnetization $M_{13A}$ of the first magnetic domain 13A is subjected to magnetization reversal, the magnetic domain wall DW moves in the −x direction. If the magnetic domain wall moves in the magnetic domain wall movement region 13, the proportion between the first magnetic domain 13A and the second magnetic domain 13B changes.

In the magnetic domain wall movement region 13, if the magnetic domain wall DW moves and the proportion between the first magnetic domain 13A and the second magnetic domain 13B changes, the resistance of the magnetic domain wall movement element 100 changes in accordance with the proportion between the first magnetic domain 13A and the second magnetic domain 13B. In addition, a resistance value of the magnetic domain wall movement element 100 changes in stages when the position of the magnetic domain wall DW is moved in stages, and the resistance value thereof continuously changes when the position of the magnetic domain wall DW is continuously moved. The magnetic domain wall movement element 100 having a resistance value which changes in stages is suitable for handling data having multiple values. The magnetic domain wall movement element 100 having a resistance value which continuously changes is suitable for handling analog data.

As illustrated in FIGS. 5 and 6, a shortest width L10min of the first ferromagnetic layer 10 in the y direction is shorter than a width L30 of the nonmagnetic layer 30 in the y direction. The width L30 of the nonmagnetic layer 30 in the y direction is an average value of the widths in the y direction. For example, when the width in the y direction changes depending on the position in the z direction, the width L30 denotes an average value thereof.

The width of the first ferromagnetic layer 10 in the y direction illustrated in FIGS. 5 and 6 varies depending on the position in the z direction. For example, a first surface 10a and a second surface 10b of the first ferromagnetic layer 10 have different widths in the y direction. The first surface 10a is a surface of the first ferromagnetic layer 10 on the nonmagnetic layer 30 side. The second surface 10b is a surface of the first ferromagnetic layer 10 on a side opposite to the first surface 10a.

The width of the first surface 10a in the y direction illustrated in FIGS. 5 and 6 is the same as the width L30 of the nonmagnetic layer 30 in the y direction. The width of the first ferromagnetic layer 10 in the y direction illustrated in FIGS. 5 and 6 becomes narrower toward the second surface 10b from the first surface 10a and becomes wider after reaching the shortest width L10min. For example, a position of the shortest width L10min is on the nonmagnetic layer 30 side from the center of the first ferromagnetic layer 10 in the z direction. The width of the first ferromagnetic layer 10 in the y direction illustrated in FIGS. 5 and 6 becomes the largest on the second surface 10b. A width of the second surface 10b in the y direction illustrated in FIGS. 5 and 6 is larger than the width L30 of the nonmagnetic layer 30 in the y direction. For example, a longest width L10max of the first ferromagnetic layer 10 in the y direction is larger than the width L30 of the nonmagnetic layer 30 in the y direction.

A side surface of the first ferromagnetic layer 10 in the y direction illustrated in FIGS. 5 and 6 is inclined in the y direction with respect to the z direction. The side surface of the first ferromagnetic layer 10 in the y direction can be divided into a first inclined surface s1 and a second inclined surface s2. The first inclined surface s1 is an inclined surface inclined toward the center of the first ferromagnetic layer 10 in the y direction based on a lower end on a side surface of the first ferromagnetic layer 10 on the substrate Sub side. The second inclined surface s2 is an inclined surface inclined toward the center of the first ferromagnetic layer 10 in the y direction based on an upper end on a side surface of the first ferromagnetic layer 10 on the nonmagnetic layer 30 side. The second inclined surface s2 is overhung with respect to the first inclined surface s1.

The first inclined surface s1 and the second inclined surface s2 sandwich an inflection point p1 at which inclination with respect to the z direction of a tangential line on the side surface of the first ferromagnetic layer 10 is zero. The inflection point p1 is on an inward side from an end part of the nonmagnetic layer 30 in the y direction. For example, the side surface of the first ferromagnetic layer 10 in the y direction is recessed with respect to an imaginary surface lowered in the z direction from the end part of the nonmagnetic layer 30 in the y direction.

The first ferromagnetic layer 10 is constituted of a magnetic substance. It is preferable that the first ferromagnetic layer 10 have at least one element selected from the group consisting of Co, Ni, Fe, Pt, Pd, Gd, Tb, Mn, Ge, and Ga. Examples of a material used for the first ferromagnetic layer 10 include a laminated film of Co and Ni, a laminated film of Co and Pt, a laminated film of Co and Pd, a MnGa-based material, a GdCo-based material, and a TbCo-based material. Ferrimagnetic substances such as a MnGa-based material, a GdCo-based material, and a TbCo-based material have small saturation magnetization and have a small threshold current necessary to move the magnetic domain wall DW. In addition, a laminated film of Co and Ni, a laminated film of Co and Pt, and a laminated film of Co and Pd have a large coercivity and have a low moving speed of the magnetic domain wall DW.

The first ferromagnetic layer 10 may include an element constituting the underlayer 40. For example, an abundance ratio of the element is higher in a first region R1 on the underlayer 40 side from a position at which the first ferromagnetic layer 10 is the shortest width L10min in the z direction than in a second region R2 on the nonmagnetic layer 30 side from a position at which the first ferromagnetic layer 10 is the shortest width L10min in the z direction.

Nonmagnetic Layer

For example, the nonmagnetic layer 30 comes into contact with the first ferromagnetic layer 10. The nonmagnetic layer 30 is provided on the first ferromagnetic layer 10. The nonmagnetic layer 30 is provided between the first ferromagnetic layer 10 and the second ferromagnetic layer 20.

For example, the nonmagnetic layer 30 is constituted of a nonmagnetic insulator, a semiconductor, or a metal. For example, the nonmagnetic insulator is made of $Al_2O_3$, $SiO_2$, MgO, $MgAl_2O_4$, and a material obtained by substituting part of Al, Si, and Mg thereof with Zn, Be, or the like. These materials have a large bandgap and excellent insulating properties. When the nonmagnetic layer 30 is constituted of a nonmagnetic insulator, the nonmagnetic layer 30 is a tunnel barrier layer. For example, a nonmagnetic metal includes Cu, Au, Ag, and the like. For example, a nonmagnetic semiconductor includes Si, Ge, $CuInSe_2$, $CuGaSe_2$, $Cu(In, Ga)Se_2$, and the like.

For example, a milling rate of the nonmagnetic layer 30 is lower than a milling rate of the first ferromagnetic layer 10. The milling rate indicates a milling rate with respect to dry etching. For example, ion-beam etching is used as dry etching. For example, a rare gas element such as Ar, Kr, or Xe, or ions thereof which is accelerated at a voltage within a range of several hundred V to several kV can be used in ion-beam etching. When the nonmagnetic layer 30 is made of oxide, the milling rate is often lower than that of the first ferromagnetic layer 10 made of a metal.

The thickness of the nonmagnetic layer 30 is preferably 20 Å or larger and more preferably 30 Å or larger. If the thickness of the nonmagnetic layer 30 is large, the product of a resistance area (RA) of the magnetic domain wall movement element 100 increases. The product of the resistance area (RA) of the magnetic domain wall movement element 100 is preferably $1\times10^4$ $\Omega\mu m^2$ or larger and more preferably $1\times10^5$ $\Omega\mu m^2$ or larger. The product of the resistance area (RA) of the magnetic domain wall movement element 100 is expressed by the product of an element resistance of one magnetic domain wall movement element 100 and an element cross-sectional area (an area of a cross-section of the nonmagnetic layer 30 cut along an xy plane) of the magnetic domain wall movement element 100.

In addition, if the thickness of the nonmagnetic layer 30 is large, impurities tend to be likely to adhere to a side wall of the nonmagnetic layer 30 again due to a difference between the milling rates of the nonmagnetic layer 30 and another layer at the time of slimming. If a relationship between the width L30 of the nonmagnetic layer 30 in the y direction and the shortest width L10min of the first ferromagnetic layer 10 in the y direction is controlled, readhesion of impurities to the side wall of the nonmagnetic layer 30 can be curbed even when the thickness of the nonmagnetic layer 30 is large.

Second Ferromagnetic Layer

The second ferromagnetic layer 20 is provided on the nonmagnetic layer 30. The second ferromagnetic layer 20 has a magnetization $M_{20}$ oriented in one direction. The magnetization $M_{20}$ of the second ferromagnetic layer 20 is less likely to be subjected to magnetization reversal than the magnetizations $M_{13A}$ and $M_{13B}$ of the magnetic domain wall movement region 13 when a predetermined external force is applied. For example, a predetermined external force is an external force applied to a magnetization due to an external magnetic field or an external force applied to a magnetization due to a spin-polarized current. The second ferromagnetic layer 20 may be referred to as a magnetization fixed layer or a magnetization reference layer.

The resistance value of the magnetic domain wall movement element 100 changes due to a difference in relative angle between a magnetization of the second ferromagnetic layer 20 and the magnetizations $M_{13A}$ and $M_{13B}$ of the magnetic domain wall movement region 13. For example, the magnetization $M_{13A}$ of the first magnetic domain 13A is in the same direction as (parallel to) the magnetization $M_{20}$ of the second ferromagnetic layer 20. For example, the magnetization $M_{13B}$ of the second magnetic domain 13B is in a direction opposite (antiparallel) to the magnetization $M_{20}$ of the second ferromagnetic layer 20. If an area of the first magnetic domain 13A in a portion overlapping the second ferromagnetic layer 20 in a plan view from the z direction widens, the resistance value of the magnetic domain wall movement element 100 decreases. On the contrary, if an area of the second magnetic domain 13B in a portion overlapping the second ferromagnetic layer 20 in a plan view from the z direction widens, the resistance value of the magnetic domain wall movement element 100 increases.

The second ferromagnetic layer 20 includes a ferromagnetic substance. For example, the second ferromagnetic layer 20 includes a material which can easily achieve a coherent tunnel effect between the second ferromagnetic layer 20 and the first ferromagnetic layer 10. For example, the second ferromagnetic layer 20 includes a metal selected from the group consisting of Cr, Mn, Co, Fe and Ni, an alloy including one or more of these metals, an alloy including these metals and at least one or more elements of B, C, and N, or the like. For example, the second ferromagnetic layer 20 is made of Co—Fe, Co—Fe—B, or Ni—Fe.

For example, the second ferromagnetic layer 20 may be a Heusler alloy. A Heusler alloy is a half-metal and has high spin polarization. A Heusler alloy is an intermetallic compound having a chemical composition of XYZ or $X_2YZ$. X is a Co, Fe, Ni, or Cu-group transition metal element, or a noble metal element on the periodic table, Y is a Mn, V, Cr or Ti-group transition metal or an element represented by X, and Z is a typical element of the group III to the group V. Examples of a Heusler alloy include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-e}Ga_c$.

When an easy magnetization axis of the second ferromagnetic layer 20 is in the z direction (having a perpendicular magnetization film), a film thickness of the second ferromagnetic layer 20 is preferably 1.5 nm or smaller and more preferably 1.0 nm or smaller. If the film thickness of the second ferromagnetic layer 20 is reduced, perpendicular magnetic anisotropy (interfacial perpendicular magnetic anisotropy) is applied to the second ferromagnetic layer 20 at an interface between the second ferromagnetic layer 20 and another layer (nonmagnetic layer 30), and thus a magnetization of the second ferromagnetic layer 20 is likely to be oriented in the z direction.

When the easy magnetization axis of the second ferromagnetic layer 20 is in the z direction (having a perpendicular magnetization film), the second ferromagnetic layer 20 is preferably a laminate of a ferromagnetic substance selected from the group consisting of Co, Fe, and Ni and a nonmagnetic substance selected from the group consisting of Pt, Pd, Ru, and Rh, and it is more preferable that an intermediate layer selected from the group consisting of Ir and Ru be inserted at any position of a laminate. If a ferromagnetic substance and a nonmagnetic substance are laminated, perpendicular magnetic anisotropy can be applied, and a magnetization of the second ferromagnetic layer 20 is likely to be oriented in the z direction by inserting an intermediate layer.

An antiferromagnetic layer may be provided on a surface of the second ferromagnetic layer 20 on a side opposite to the nonmagnetic layer 30 with a spacer layer therebetween. The second ferromagnetic layer 20, the spacer layer, and the antiferromagnetic layer form a synthetic antiferromagnetic structure (SAF structure). The synthetic antiferromagnetic structure is constituted of two magnetic layers sandwiching the nonmagnetic layer. Due to antiferromagnetic coupling between the second ferromagnetic layer 20 and the antiferromagnetic layer, the coercivity of the second ferromagnetic layer 20 further increases than a case of having no antiferromagnetic layer. For example, the antiferromagnetic layer is made of IrMn, PtMn, or the like. For example, a spacer layer includes at least one selected from the group consisting of Ru, Ir, and Rh.

The underlayer 40 is on a side of the first ferromagnetic layer 10 opposite to the nonmagnetic layer 30. The underlayer 40 may be provided at only a position overlapping the magnetic domain wall movement region 13 in the z direction.

The underlayer 40 is constituted of a nonmagnetic substance. For example, the underlayer 40 regulates a crystal structure of the first ferromagnetic layer 10. Crystallinity of the first ferromagnetic layer 10 is enhanced due to the crystal structure of the underlayer 40, and orientation of magnetization of the first ferromagnetic layer 10 is enhanced. For example, the crystal structure of the underlayer 40 is amorphous, a (001) oriented NaCl structure, a (002) oriented Perovskite structure expressed by the compositional formula of $ABO_3$, a (001) oriented tetragonal structure, or a cubic structure.

The underlayer 40 is a conductor or an insulator. The underlayer 40 is preferably a conductor. When the underlayer 40 is a conductor, a thickness of the underlayer 40 is preferably smaller than the thickness of the first ferromagnetic layer 10. For example, the underlayer 40 includes Ta, Ru, Pt, Ir, Rh, W, Pd, Cu, Au, and Cu. For example, the underlayer 40 is a Ta layer, a Pt layer, or a laminate of a Ta layer and a Pt layer.

For example, the underlayer 40 has a lower milling rate than the first ferromagnetic layer 10. In addition, for example, the underlayer 40 has a lower milling rate than the first conductive part 51 and the second conductive part 52. For example, the foregoing relationships are satisfied when the underlayer 40 includes one or more elements selected from Al, Cr, Mg, Ta, Ti, and W, the first ferromagnetic layer 10 includes one or more elements selected from Co, Fe, Ni, Pt, Pd, Ir, and Rh, and the first conductive part 51 and the second conductive part 52 are alloys or laminates including one or more elements selected from Au, Cu, and Ru. Specifically, examples thereof include a case in which the underlayer is made of Ta or is a laminated film of Ta and Pt, the first ferromagnetic layer 10 is a laminated film of Co and Pt, and the first conductive part 51 and the second conductive part 52 are made of Au.

For example, the thickness of the underlayer 40 is substantially uniform within an xy plane. For example, an average thickness of the underlayer 40 is 50 Å or smaller. The average thickness is an average value of the thicknesses of the underlayer 40 measured at respective positions in the x direction of the underlayer 40 divided into ten at equal intervals in the x direction.

First Conductive Part and Second Ferromagnetic Part

The first conductive part 51 and the second conductive part 52 are electrically connected to the first ferromagnetic layer 10. For example, the first conductive part 51 and the second conductive part 52 are connected to each other with the underlayer 40 therebetween as illustrated in FIG. 6. The first conductive part 51 and the second conductive part 52 may be directly connected to the first ferromagnetic layer 10. For example, the first conductive part 51 is connected to a first end part of the first ferromagnetic layer 10. For example, the second conductive part 52 is connected to a second end part of the first ferromagnetic layer 10. For example, the first conductive part 51 and the second conductive part 52 are connection parts between the wiring W and the first ferromagnetic layer 10.

The first conductive part 51 and the second conductive part 52 are columnar bodies. The shapes of the first conductive part 51 and the second conductive part 52 illustrated in FIG. 4 in a plan view from the z direction are rectangular shapes. There is no limit to the shapes of the first conductive part 51 and the second conductive part 52 in a plan view from the z direction, and circular shapes, elliptical shapes, or indefinite shapes may be adopted. For example, the widths of the first conductive part 51 and the second conductive part 52 in the y direction are larger than the widths of the first ferromagnetic layer 10 and the nonmagnetic layer 30 in the y direction. For example, upper surfaces of the first conductive part 51 and the second conductive part 52 are etched and are recessed with respect to an xy plane.

The first conductive part 51 and the second conductive part 52 are formed of a conductive material. For example, the first conductive part 51 and the second conductive part 52 include a magnetic substance. For example, the first conductive part 51 and the second conductive part 52 include a metal selected from the group consisting of Cr, Mn, Co, Fe and Ni, an alloy including one or more of these metals, an alloy including these metals and at least one or more elements of B, C, and N, or the like. For example, the first conductive part 51 and the second conductive part 52 are made of Co—Fe, Co—Fe—B, Ni—Fe, or the like. In addition, when the easy magnetization axes of the first conductive part 51 and the second conductive part 52 are in the z direction (having a perpendicular magnetization film), the first conductive part 51 and the second conductive part 52 are preferably laminates of a ferromagnetic substance selected from the group consisting of Co, Fe, and Ni and a nonmagnetic substance selected from the group consisting of Pt, Pd, Ru, and Rh. In addition, the first conductive part 51 and the second conductive part 52 may have a synthetic antiferromagnetic structure (SAF structure). The synthetic antiferromagnetic structure is constituted of two magnetic layers sandwiching the nonmagnetic layer. Two magnetic layers have fixed magnetizations, and directions of the fixed magnetizations are opposite to each other.

When the first conductive part 51 includes a magnetic substance, a magnetization $M_{51}$ of the first conductive part 51 is oriented in one direction. For example, the magnetization $M_{51}$ is oriented in the +z direction. The first conductive part 51 fixes the magnetization $M_{11}$ of the magnetization fixed region 11. For example, the magnetization $M_{51}$ of the first conductive part 51 and the magnetization $M_{11}$ of the magnetization fixed region 11 are oriented in the same direction.

When the second conductive part 52 includes a magnetic substance, a magnetization $M_{52}$ of the second conductive part 52 is oriented in a direction different from that of the magnetization $M_{51}$ of the first conductive part 51. For example, the magnetization $M_{52}$ is oriented in the −z direction. In this case, the second conductive part 52 fixes the magnetization $M_{12}$ of the magnetization fixed region 12, and for example, the magnetization $M_{52}$ of the second conductive part 52 and the magnetization $M_{12}$ of the magnetization fixed region 12 are oriented in the same direction.

For example, the direction of the magnetization of each layer in the magnetic domain wall movement element 100 can be confirmed by measuring a magnetization curve. For example, a magnetization curve can be measured using a magneto optical Kerr effect (MOKE). Measurement using an MOKE is a measuring method performed by causing linearly polarized light to be incident on a measurement target and using a magneto-optic effect (magnetic Kerr effect) in which rotation or the like in a polarization direction thereof occurs.

Subsequently, a method of manufacturing the magnetic recording array 200 will be described. The magnetic recording array 200 is formed through a lamination step for each layer, and a processing step of processing a portion of each layer into a predetermined shape. A sputtering method, a chemical vapor deposition (CVD) method, an electron beam deposition method (EB deposition method), an atom laser deposition method, or the like can be used for lamination of each layer. Each layer can be processed using photolithography or the like.

First, the source region S and the drain region D are formed by doping a predetermined position of the substrate Sub with impurities. Subsequently, the gate insulating film GI and the gate electrode G are formed between the source region S and the drain region D. The source region S, the drain region D, the gate insulating film GI, and the gate electrode G become the transistors Tr.

Subsequently, the insulating layer In is formed such that the transistors Tr are covered. In addition, an opening part is formed in the insulating layer In, and the wiring W is formed by filling the inside of the opening part with a conductor. The first wiring Wp and the second wiring Cm are formed by laminating the insulating layer In up to a predetermined thickness, forming a groove in the insulating layer In thereafter, and filling the groove with a conductor.

For example, the first conductive part 51 and the second conductive part 52 can be formed by laminating a ferromagnetic layer on one surface of the insulating layer In and the wiring W and removing portions other than the first conductive part 51 and the second conductive part 52. For example, removed portions are filled with the insulating layer In.

Subsequently, the underlayer 40, the first ferromagnetic layer 10, and the nonmagnetic layer 30 are laminated in this order on the first conductive part 51, the second conductive part 52, and the insulating layer In. Further, a resist is formed in a portion on the nonmagnetic layer 30. Subsequently, the underlayer 40, the first ferromagnetic layer 10, and the nonmagnetic layer 30 are processed by performing dry etching in the z direction via the resist. The yz cross-sectional shape of the processed laminate becomes a rectangular shape or a trapezoidal shape.

Subsequently, irradiation is performed with an ion beam in an oblique direction aiming at the first ferromagnetic layer 10 of the laminate. Due to irradiation with an ion beam, the first ferromagnetic layer 10 is recessed toward the center of the laminate in the y direction. Thereafter, the second ferromagnetic layer 20 is laminated at a position overlapping the first ferromagnetic layer 10.

Last, the laminate in its entirety is slimmed by further reducing an irradiation angle of an ion beam with respect to an xy plane and performing irradiation with an ion beam in a lateral direction of the laminate. The laminate is miniaturized due to slimming Last, the magnetic domain wall movement element 100 is obtained by filling the area around the laminate with the insulating layer In.

Figure 7:
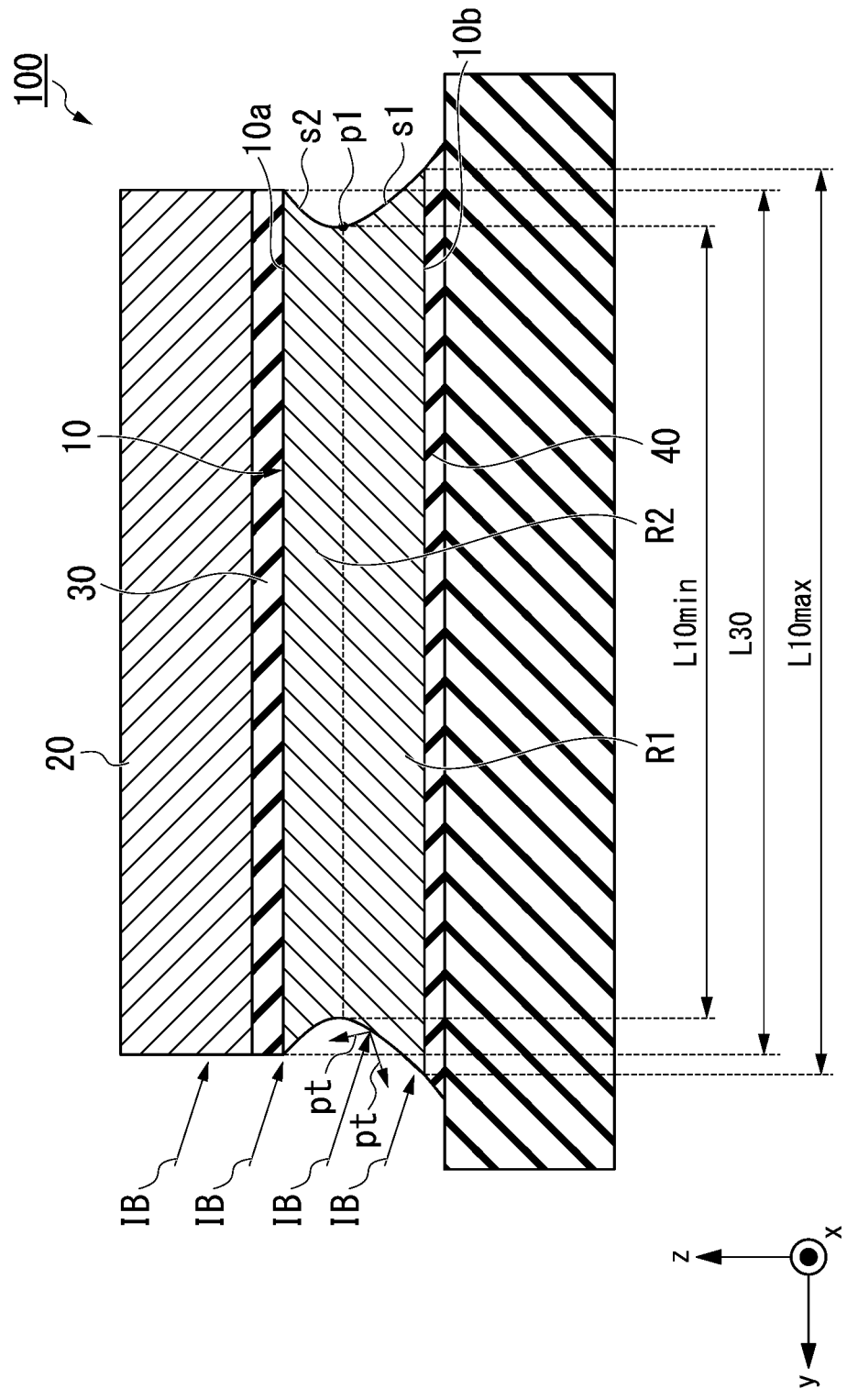
FIG. 7 is a schematic view for describing slimming when preparing the magnetic domain wall movement element according to the first embodiment.

In the magnetic domain wall movement element 100 according to the first embodiment, impurities are unlikely to adhere to a side surface of the nonmagnetic layer 30 again at the time of slimming. The reason for this will be described using FIG. 7. FIG. 7 is a schematic view for describing slimming when preparing the magnetic domain wall movement element 100 according to the first embodiment.

As described above, at the time of slimming, a laminate constituted of the underlayer 40, the first ferromagnetic layer 10, the nonmagnetic layer 30, and the second ferromagnetic layer 20 is irradiated with an ion beam IB in the y direction. It is difficult to perform irradiation with the ion beam IB in a manner of being parallel to the y direction, and thus irradiation is performed with the ion beam IB in a direction slightly inclined in the z direction with respect to an xy plane. For example, if the first ferromagnetic layer 10 is irradiated with the ion beam TB, metal particles included in the first ferromagnetic layer 10 scatter as particles pt.

In the magnetic domain wall movement element 100 according to the first embodiment, since the shortest width L10min of the first ferromagnetic layer 10 in the y direction is shorter than the width L30 of the nonmagnetic layer 30 in the y direction, the nonmagnetic layer 30 becomes a cover, and thus readhesion of the particles pt to the side wall of the nonmagnetic layer 30 is curbed.

In addition, if the first ferromagnetic layer 10 has the second inclined surface s2, since the second inclined surface s2 is overhung with respect to the first inclined surface s1, arrival of the particles pt at the side wall of the nonmagnetic layer 30 can be further curbed. In addition, if the position at which the width of the first ferromagnetic layer 10 in the y direction is the shortest is on the nonmagnetic layer 30 side from the center of the first ferromagnetic layer 10 in the z direction, a portion close to the nonmagnetic layer 30 is recessed inward, and thus arrival of the particles pt at the side wall of the nonmagnetic layer 30 can be further curbed.

In addition, if the milling rates of the nonmagnetic layer 30 and the underlayer 40 are lower than that of the first ferromagnetic layer 10, the side surface of the first ferromagnetic layer 10 enters the inward side with respect to the side surfaces of the nonmagnetic layer 30 and the underlayer 40 as slimming proceeds. For this reason, the nonmagnetic layer 30 becomes a cover, and thus readhesion of the particles pt to the side wall of the nonmagnetic layer 30 is further curbed. In addition, if the milling rate of the underlayer 40 is lower than the milling rates of the first conductive part 51 and the second conductive part 52, the underlayer 40 becomes a cover, and thus arrival of the particles pt which have scattered from the first conductive part 51 or the second conductive part 52 at the side wall of the nonmagnetic layer 30 can be further curbed.

In addition, if the first ferromagnetic layer 10 includes an element constituting the underlayer 40, the quantity of the particles pt scattering from the first ferromagnetic layer 10 can be reduced. In addition, when the abundance ratio of an element constituting the underlayer 40 in the first region R1 is higher than that in the second region R2, it is possible to curb generation of the particles pt from the first region R1 in which a path for the particles pt arriving at the nonmagnetic layer 30 is easily secured.

Impurities formed by adhered particles degrade the MR ratio of the magnetic domain wall movement element 100 and short-circuit the first ferromagnetic layer 10 and the second ferromagnetic layer 20 in some cases. The magnetic domain wall movement element 100 according to the first embodiment can reduce adhesion of impurities to the side wall of the nonmagnetic layer 30, thereby having high reliability.

Hereinabove, examples of the magnetic recording array 200 and the magnetic domain wall movement element 100 according to the first embodiment have been described in detail. However, the magnetic recording array 200 and the magnetic domain wall movement element 100 according to the first embodiment can be subjected to various modifications and changes within the range of the gist of the present invention.

First Modification Example

Figure 8:
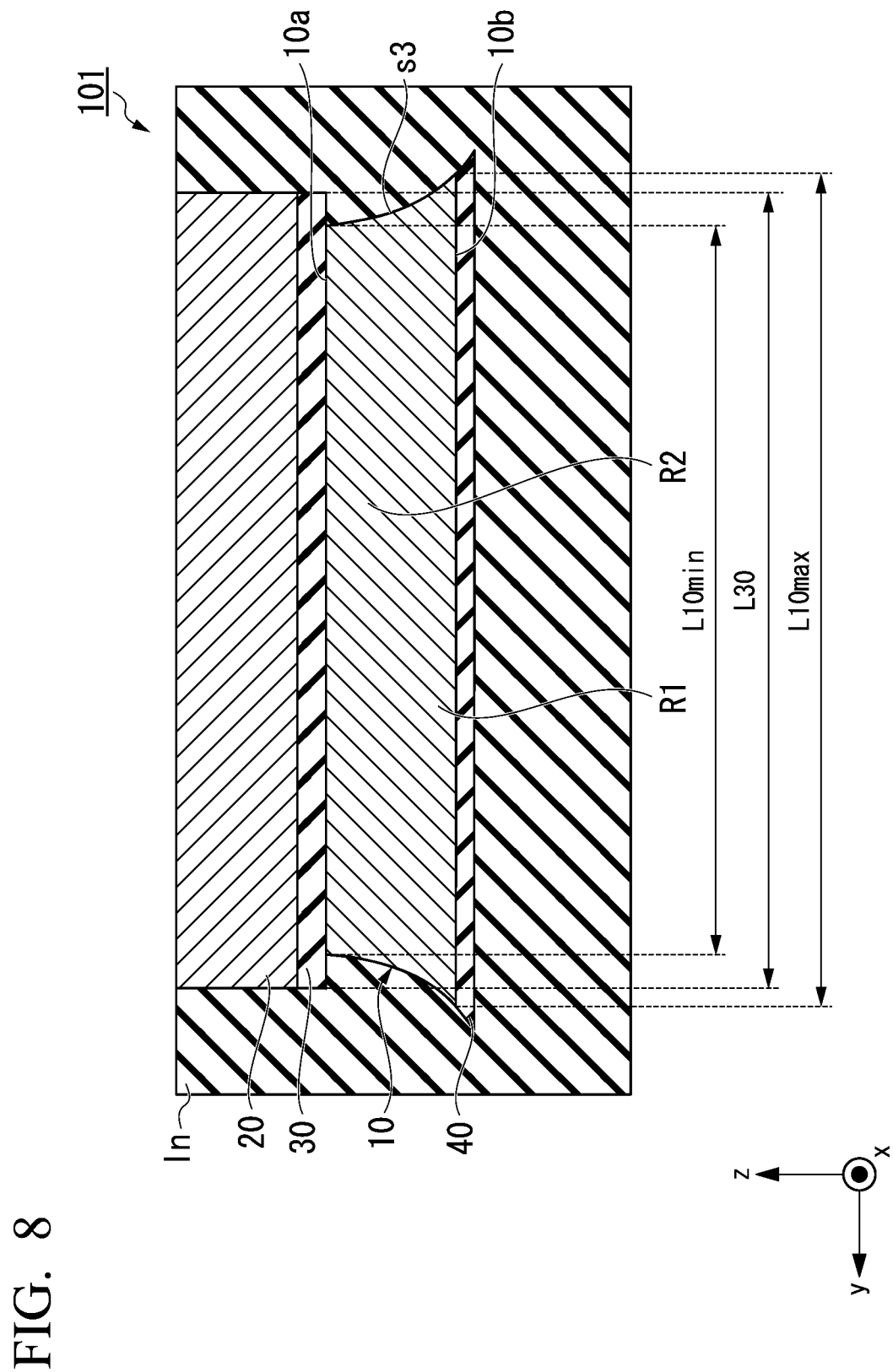
FIG. 8 is a yz cross-sectional view at a center of a magnetic domain wall movement element according to a first modification example in the x direction.

FIG. 8 is a yz cross-sectional view at a center of a magnetic domain wall movement element 101 according to a first modification example in the x direction. The magnetic domain wall movement element 101 has the shape of the side surface of the first ferromagnetic layer 10 different from that of the magnetic domain wall movement element 100. In the magnetic domain wall movement element 101, similar reference signs are applied to constitutions similar to those of the magnetic domain wall movement element 100, and description thereof will be omitted.

The side surface of the first ferromagnetic layer 10 in the y direction illustrated in FIG. 8 is an inclined surface s3 inclined in the y direction with respect to the z direction. The inclined surface s3 is an inclined surface inclined in a manner of being separated from the center of the first ferromagnetic layer 10 in the y direction based on the upper end on the side surface of the first ferromagnetic layer 10 on the nonmagnetic layer 30 side.

The width of the first surface 10a in the y direction illustrated in FIG. 8 is shorter than the width L30 of the nonmagnetic layer 30 in the y direction. The width of the first ferromagnetic layer 10 in the y direction illustrated in FIG. 8 becomes wider toward the second surface 10b from the first surface 10a. The width of the first ferromagnetic layer 10 in the y direction illustrated in FIG. 8 becomes the smallest on the first surface 10a and becomes the largest on the second surface 10b.

In the magnetic domain wall movement element 101 according to the first modification example, a portion on the side surface of the first ferromagnetic layer 10 in the y direction is on an inward side from the nonmagnetic layer 30. For this reason, the nonmagnetic layer 30 becomes a hood, and thus readhesion of the particles pt which have scattered from the first ferromagnetic layer 10 to the side wall of the nonmagnetic layer 30 can be curbed.

Second Modification Example

Figure 9:
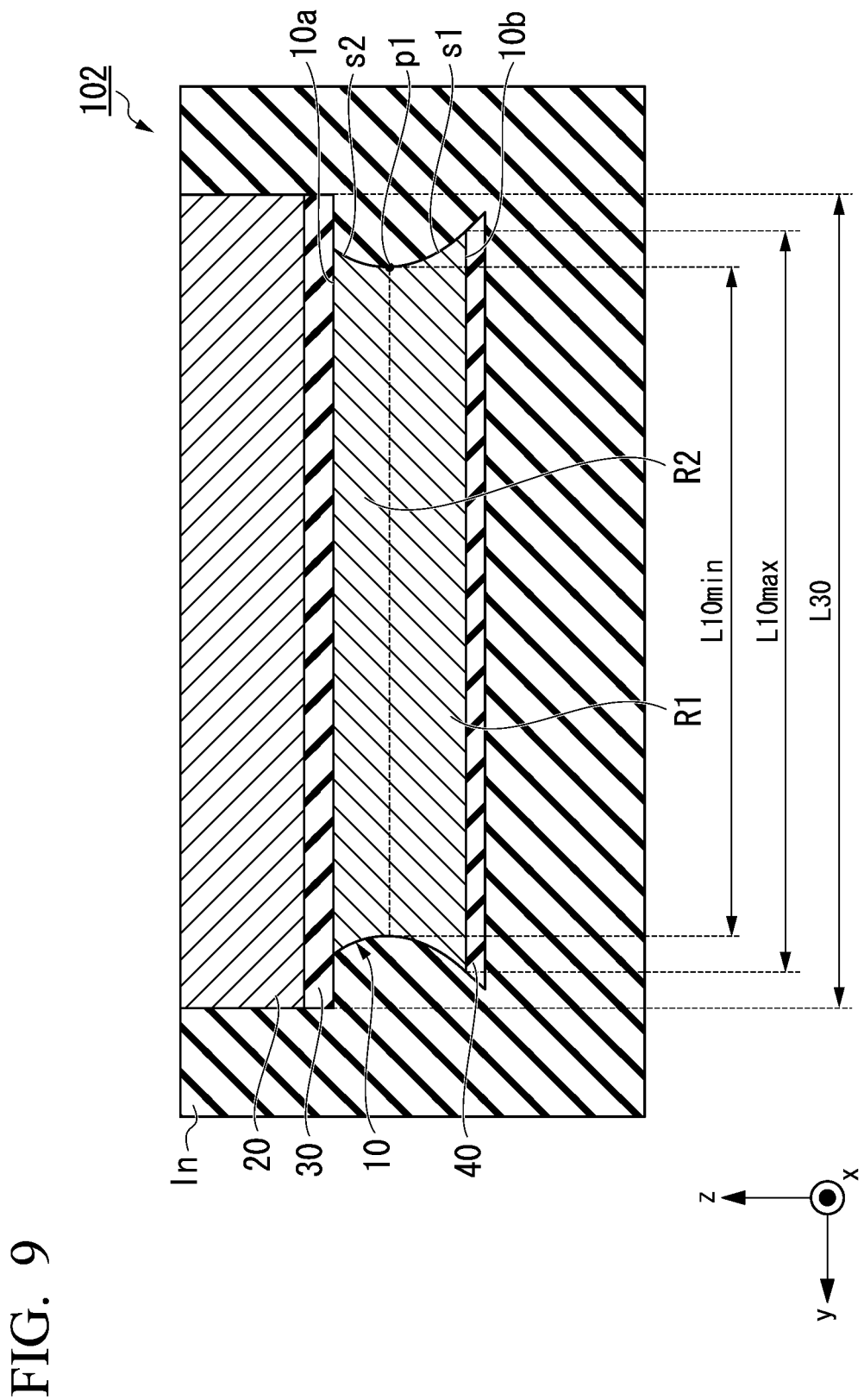
FIG. 9 is a yz cross-sectional view at a center of a magnetic domain wall movement element according to a second modification example in the x direction.

FIG. 9 is a yz cross-sectional view at a center of a magnetic domain wall movement element 102 according to a second modification example in the x direction. The magnetic domain wall movement element 102 has a shape of the side surface of the first ferromagnetic layer 10 different from that of the magnetic domain wall movement element 100. In the magnetic domain wall movement element 102, similar reference signs are applied to constitutions similar to those of the magnetic domain wall movement element 100, and description thereof will be omitted.

The magnetic domain wall movement element 102 according to the second modification example is the same as the magnetic domain wall movement element 100 in that the width of the first ferromagnetic layer 10 in the y direction becomes the largest on the second surface 10b but differs therefrom in that the width of the second surface 10b in the y direction is shorter than the width L30 of the nonmagnetic layer 30 in the y direction. For example, in the magnetic domain wall movement element 102 according to the second modification example, the longest width L10max of the first ferromagnetic layer 10 in the y direction is shorter than the width L30 of the nonmagnetic layer 30 in the y direction.

In the magnetic domain wall movement element 102 according to the second modification example, the side surface of the first ferromagnetic layer 10 in the y direction is on an inward side from the nonmagnetic layer 30. For this reason, the nonmagnetic layer 30 becomes a hood, and thus readhesion of the particles pt which have scattered from the first ferromagnetic layer 10 to the side wall of the nonmagnetic layer 30 can be curbed.

Third Modification Example

Figure 10:
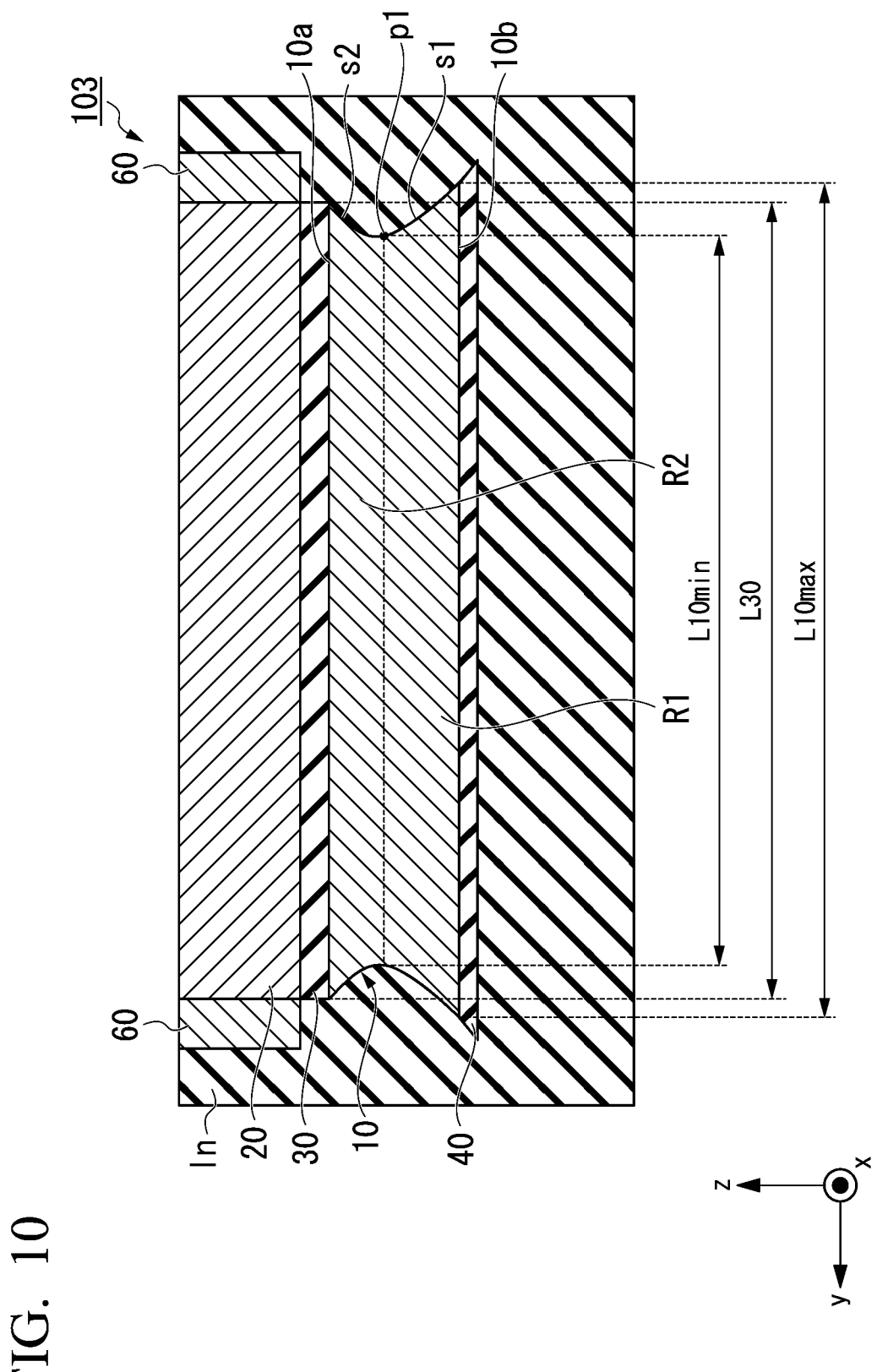
FIG. 10 is a yz cross-sectional view at a center of a magnetic domain wall movement element according to a third modification example in the x direction.

FIG. 10 is a yz cross-sectional view at a center of a magnetic domain wall movement element 103 according to a third modification example in the x direction. The magnetic domain wall movement element 103 differs from the magnetic domain wall movement element 100 in having a metal layer 60 on a side surface of the second ferromagnetic layer 20. In the magnetic domain wall movement element 103, similar reference signs are applied to constitutions similar to those of the magnetic domain wall movement element 100, and description thereof will be omitted.

For example, the metal layer 60 is on a side next to the second ferromagnetic layer 20 in the y direction. For example, the metal layer 60 comes into contact with the side surface of the second ferromagnetic layer 20 in the y direction. Another layer may be provided between the second ferromagnetic layer 20 and the metal layer 60. For example, another layer is an oxide film.

The metal layer 60 is not connected to the second ferromagnetic layer 20. A state of being not connected denotes that an interface can be checked using a transmission electron microscope. The metal layer 60 differs from the second ferromagnetic layer 20. A state of being different from the second ferromagnetic layer 20 denotes that the material or the composition is different. The metal layer 60 may be made of a nonmagnetic substance or a magnetic substance.

In the magnetic domain wall movement element 103 according to the third modification example, effects similar to those of the magnetic domain wall movement element 100 according to the first embodiment can be obtained. In addition, since the metal layer 60 protrudes outward beyond the first ferromagnetic layer 10, heat dissipation of the magnetic domain wall movement element 103 is improved.

Second Embodiment

Figure 11:
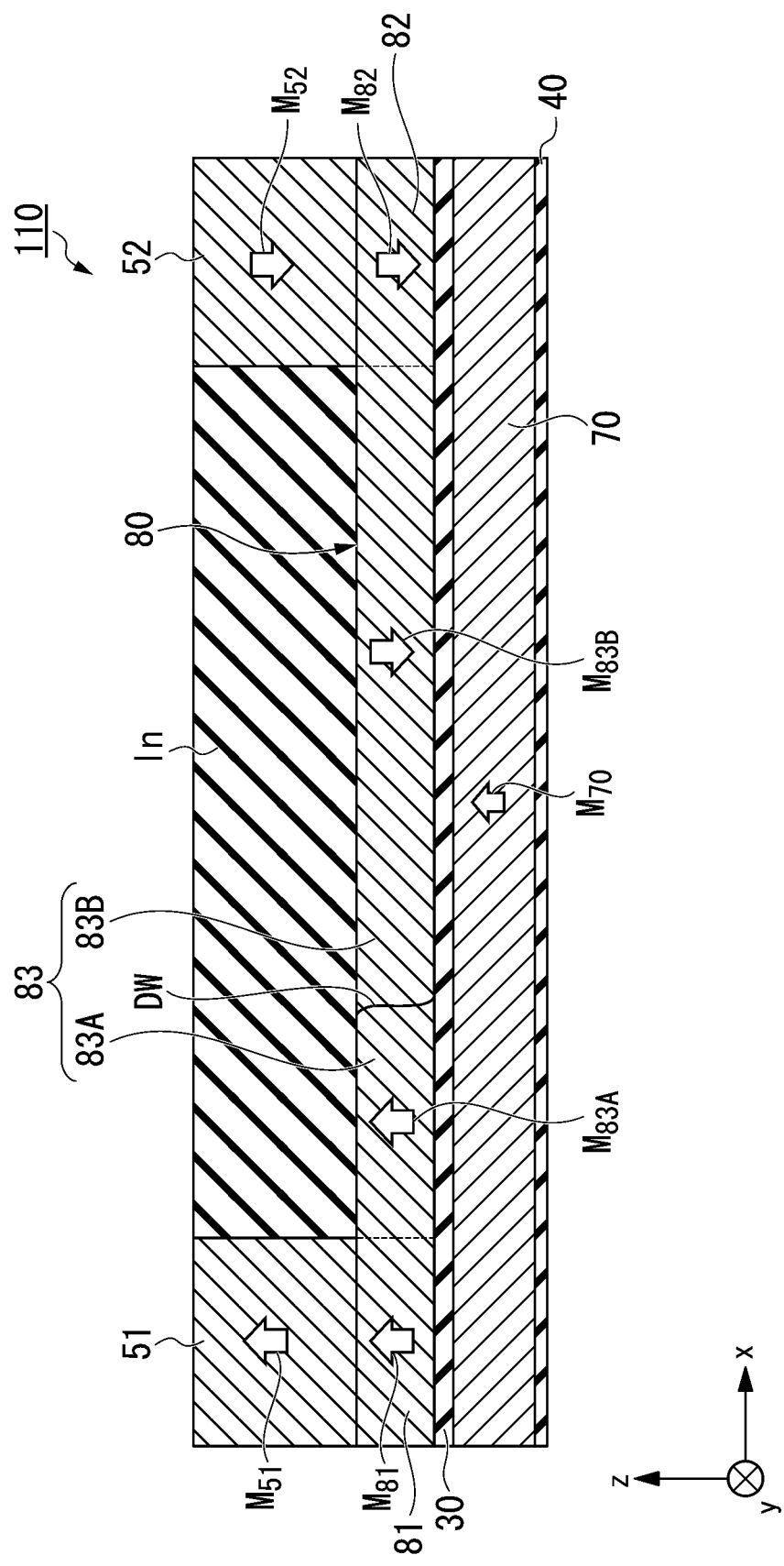
FIG. 11 is an xz cross-sectional view of a magnetic domain wall movement element according to a second embodiment.
Figure 12:
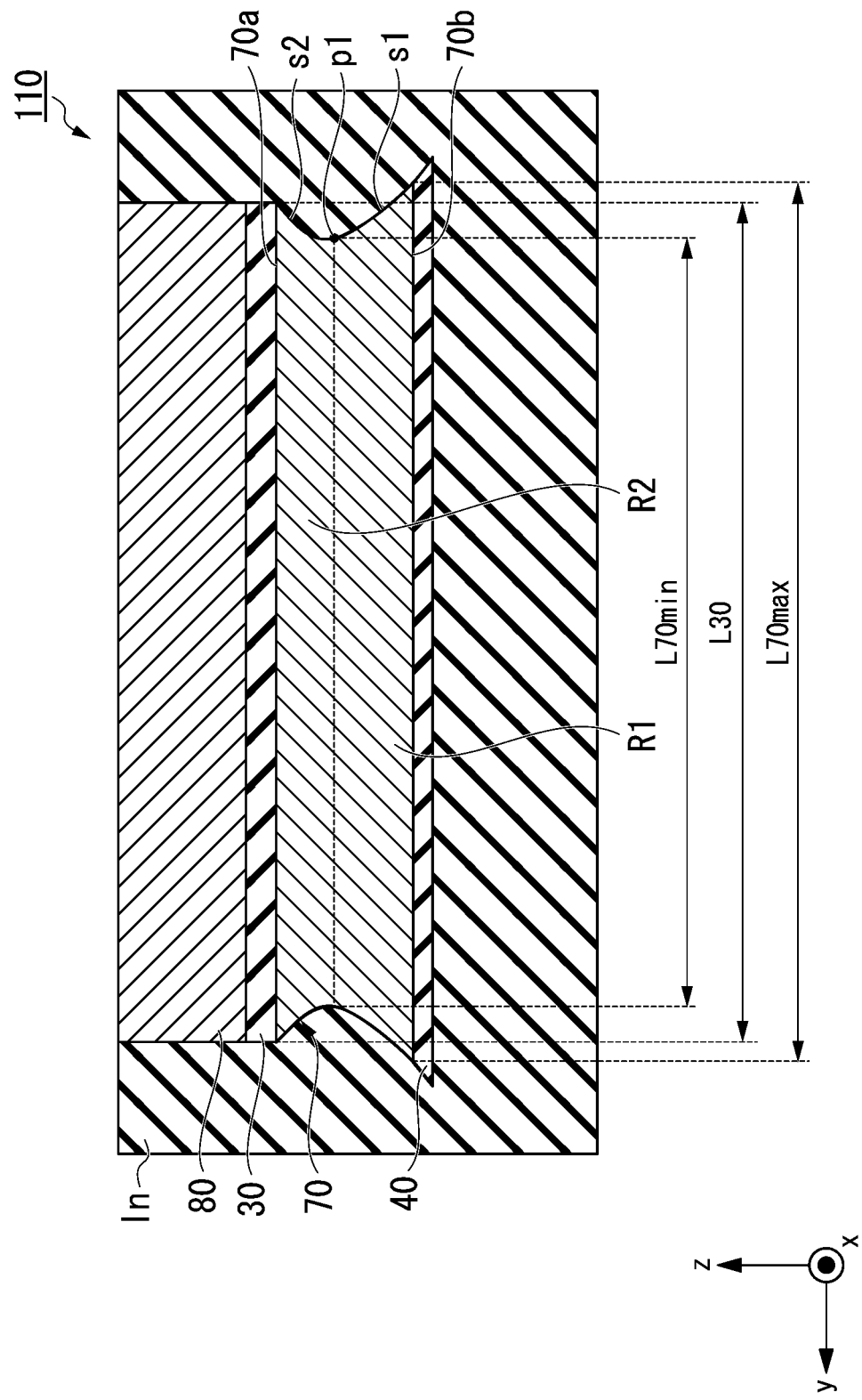
FIG. 12 is a yz cross-sectional view at a center of the magnetic domain wall movement element according to the second embodiment in the x direction.

FIG. 11 is a cross-sectional view of a magnetic domain wall movement element 110 according to a second embodiment cut along an xz plane passing through the center of a first ferromagnetic layer 70 in the y direction. FIG. 12 is a cross-sectional view cut along a yz plane passing through the center of the magnetic domain wall movement element 110 in the x direction. A plan view of the magnetic domain wall movement element 110 according to the second embodiment in the z direction is equivalent to that in FIG. 4.

For example, the magnetic domain wall movement element 110 has the first ferromagnetic layer 70, a second ferromagnetic layer 80, the nonmagnetic layer 30, the underlayer 40, the first conductive part 51, and the second conductive part 52. In the magnetic domain wall movement element 110, similar reference signs are applied to constitutions similar to those of the first embodiment. The first ferromagnetic layer 70 is on the substrate Sub side from the second ferromagnetic layer 80.

When data is written in the magnetic domain wall movement element 110, a writing current flows in the second ferromagnetic layer 80 between the first conductive part 51 and the second conductive part 52. When data is read from the magnetic domain wall movement element 110, a reading current flows between the first conductive part 51 or the second conductive part 52 and the first ferromagnetic layer 70.

The first ferromagnetic layer 70 has a magnetization $M_{70}$ oriented in one direction. The first ferromagnetic layer 70 is a magnetization fixed layer or a magnetization reference layer. The first ferromagnetic layer 70 is functionally equivalent to the second ferromagnetic layer 20 according to the first embodiment. The magnetic domain wall movement element 110 has a bottom-pin structure in which the magnetization fixed layer is on the substrate Sub side. A material similar to that of the second ferromagnetic layer 20 can be used for the first ferromagnetic layer 70. The first ferromagnetic layer 70 may include an element constituting the underlayer 40.

The second ferromagnetic layer 80 is electrified with a writing current. The second ferromagnetic layer 80 is functionally similar to the first ferromagnetic layer 10 according to the first embodiment. A material similar to that of the first ferromagnetic layer 10 can be used for the second ferromagnetic layer 80.

The second ferromagnetic layer 80 is a layer capable of performing magnetic recording of information in accordance with change in internal magnetic state. The second ferromagnetic layer 80 may be referred to as a magnetic recording layer or a magnetic domain wall moving layer. The second ferromagnetic layer 80 has magnetization fixed regions 81 and 82 and a magnetic domain wall movement region 83. A magnetization $M_{81}$ of the magnetization fixed region 81 and a magnetization $M_{82}$ of the magnetization fixed region 82 are oriented in directions opposite to each other. The magnetic domain wall movement region 83 has a first magnetic domain 83A and a second magnetic domain 83B. A boundary between the first magnetic domain 83A and the second magnetic domain 83B is the magnetic domain wall DW. A magnetization $M_{83A}$ and a magnetization $M_{83B}$ are oriented in directions opposite to each other with the magnetic domain wall DW sandwiched therebetween.

As illustrated in FIG. 12, a shortest width L70min of the first ferromagnetic layer 70 in the y direction is shorter than the width L30 of the nonmagnetic layer 30 in the y direction. A width of the first ferromagnetic layer 70 in the y direction varies depending on the position in the z direction. For example, a first surface 70a and a second surface 70b of the first ferromagnetic layer 70 have different widths in the y direction. The width of the first ferromagnetic layer 70 in the y direction becomes narrower toward the second surface 10b from the first surface 10a and becomes wider after reaching the shortest width L70min. For example, a position of the shortest width L70min is on the nonmagnetic layer 30 side from the center of the first ferromagnetic layer 10 in the z direction. For example, a longest width L70max of the first ferromagnetic layer 70 in the y direction is larger than the width L30 of the nonmagnetic layer 30 in the y direction.

For example, a side surface of the first ferromagnetic layer 70 in the y direction is inclined in the y direction with respect to the z direction. The side surface of the first ferromagnetic layer 70 in the y direction can be divided into the first inclined surface s1 and the second inclined surface s2. For example, the side surface of the first ferromagnetic layer 70 in the y direction is recessed with respect to an imaginary surface lowered in the z direction from the end part of the nonmagnetic layer 30 in the y direction.

For example, the milling rate of the nonmagnetic layer 30 is lower than a milling rate of the first ferromagnetic layer 70. For example, the underlayer 40 has a lower milling rate than the first ferromagnetic layer 70.

In the magnetic domain wall movement element 110 according to the second embodiment, since the shortest width L70min of the first ferromagnetic layer 70 in the y direction is shorter than the width L30 of the nonmagnetic layer 30 in the y direction, the nonmagnetic layer 30 becomes a cover, and thus readhesion of the particles pt to the side wall of the nonmagnetic layer 30 is curbed. The magnetic domain wall movement element 110 according to the second embodiment exhibits effects similar to those of the magnetic domain wall movement element 100 according to the first embodiment. In addition, the magnetic domain wall movement element 110 according to the second embodiment may select modification examples similar to those of the first embodiment.

Hereinabove, each of the preferable embodiments of the present invention has been described in detail. Characteristic constitutions in each of the embodiments and modification examples may be combined.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES 10, 70 First ferromagnetic layer
10a, 70a First surface
10b, 70b Second surface
20, 80 Second ferromagnetic layer
30 Nonmagnetic layer
40 Underlayer
51 First conductive part
52 Second conductive part
60 Metal layer
100, 101, 102, 103, 110 Magnetic domain wall movement element
200 Magnetic recording array
L10max Longest width
L10min Shortest width
L30 Width
R1 First region
R2 Second region
s1 First inclined surface
s2 Second inclined surface
s3 Inclined surface

What is claimed is:

1. A magnetic domain wall movement element comprising:
   a substrate, a first ferromagnetic layer, a nonmagnetic layer, and a second ferromagnetic layer, wherein
   the first ferromagnetic layer, the nonmagnetic layer, and the second ferromagnetic layer are laminated in this order, and the first ferromagnetic layer is provided on a side of the substrate from the second ferromagnetic layer,
   in the magnetic domain wall movement element, a lamination direction is a direction of laminating the first ferromagnetic layer, the nonmagnetic layer, and the second ferromagnetic layer, a first direction is a direction along with a long axis of the first ferromagnetic layer in a plan view from the lamination direction, and a second direction is a direction along with a short axis of the first ferromagnetic layer in the plan view,
   on a cross-section along the lamination direction and the second direction orthogonal to the first direction, a shortest width of the first ferromagnetic layer in the second direction is shorter than a width of the nonmagnetic layer in the second direction, and
   a writing current flows along the first direction of the second ferromagnetic layer.

2. The magnetic domain wall movement element according to claim 1,
   wherein, on the cross-section, a side surface of the first ferromagnetic layer is inclined with respect to the lamination direction.

3. The magnetic domain wall movement element according to claim 2,
   wherein, on the cross-section, the side surface of the first ferromagnetic layer has a first inclined surface and a second inclined surface,
   wherein the first inclined surface is inclined toward a center of the first ferromagnetic layer in the second direction from a lower end of the first ferromagnetic layer on a side close to the substrate, and
   wherein the second inclined surface is inclined toward the center of the first ferromagnetic layer in the second direction from an upper end of the first ferromagnetic layer on a side far from the substrate.

4. The magnetic domain wall movement element according to claim 1,
   wherein a width of a first surface of the first ferromagnetic layer on the nonmagnetic layer side in the second direction is shorter than the width of the nonmagnetic layer in the second direction.

5. The magnetic domain wall movement element according to claim 1,
   wherein a position at which a width of the first ferromagnetic layer in the second direction is the shortest is on the nonmagnetic layer side from a center of the first ferromagnetic layer in the lamination direction.

6. The magnetic domain wall movement element according to claim 1,
   wherein a longest width of the first ferromagnetic layer in the second direction is shorter than the width of the nonmagnetic layer in the second direction.

7. The magnetic domain wall movement element according to claim 1,
   wherein a width of a second surface of the first ferromagnetic layer on a side far from the nonmagnetic layer in the second direction is longer than the width of the nonmagnetic layer in the second direction.

8. The magnetic domain wall movement element according to claim 1,
   wherein a thickness of the nonmagnetic layer is 30 Å or larger.

9. The magnetic domain wall movement element according to claim 1,
   wherein a milling rate of the nonmagnetic layer is lower than a milling rate of the first ferromagnetic layer.

10. The magnetic domain wall movement element according to claim 1, further comprising:
    an underlayer that is provided on a side of the first ferromagnetic layer opposite to the nonmagnetic layer,
    wherein a milling rate of the underlayer is lower than the first ferromagnetic layer.

11. The magnetic domain wall movement element according to claim 10,
    wherein the first ferromagnetic layer includes an element constituting the underlayer, and
    wherein an abundance ratio of the element is higher in a first region of the first ferromagnetic layer on the underlayer side from a position at which the width of the first ferromagnetic layer in the second direction is the shortest in the lamination direction than in a second region of the first ferromagnetic layer on the nonmagnetic layer side from a position at which the width of the first ferromagnetic layer in the second direction is the shortest in the lamination direction.

12. The magnetic domain wall movement element according to claim 1, further comprising:
a metal layer having a different material or composition from the second ferromagnetic layer on a side next to the second ferromagnetic layer in the second direction.

13. A magnetic recording array comprising:
a plurality of magnetic domain wall movement elements according to claim 1.

14. The magnetic domain wall movement element according to claim 2,
wherein a width of a first surface of the first ferromagnetic layer on the nonmagnetic layer side in the second direction is shorter than the width of the nonmagnetic layer in the second direction.

15. The magnetic domain wall movement element according to claim 3,
wherein a width of a first surface of the first ferromagnetic layer on the nonmagnetic layer side in the second direction is shorter than the width of the nonmagnetic layer in the second direction.

16. The magnetic domain wall movement element according to claim 2,
wherein a position at which a width of the first ferromagnetic layer in the second direction is the shortest is on the nonmagnetic layer side from a center of the first ferromagnetic layer in the lamination direction.

17. The magnetic domain wall movement element according to claim 3,
wherein a position at which a width of the first ferromagnetic layer in the second direction is the shortest is on the nonmagnetic layer side from a center of the first ferromagnetic layer in the lamination direction.

18. The magnetic domain wall movement element according to claim 4,
wherein a position at which a width of the first ferromagnetic layer in the second direction is the shortest is on the nonmagnetic layer side from a center of the first ferromagnetic layer in the lamination direction.

19. The magnetic domain wall movement element according to claim 2,
wherein a longest width of the first ferromagnetic layer in the second direction is shorter than the width of the nonmagnetic layer in the second direction.

* * * * *